United States Patent

Reimann et al.

[11] Patent Number: 6,081,338
[45] Date of Patent: Jun. 27, 2000

[54] METHOD AND APPARATUS FOR OPTICALLY CHECKING AN ELECTRICAL COMPONENT AT AN EQUIPPING HEAD

[75] Inventors: Guenter Reimann, Munich; Gerhard Jonke, Gilching; Rudolf Kornek, Friedberg, all of Germany

[73] Assignee: Siemens Aktiengesellschaft, Munich, Germany

[21] Appl. No.: 09/115,050

[22] Filed: Jul. 14, 1998

[30] Foreign Application Priority Data

Mar. 26, 1998 [DE] Germany .................... 198 13 506

[51] Int. Cl.$^7$ .................................................. G01B 11/02

[52] U.S. Cl. ............................................ 356/383; 386/387

[58] Field of Search ......................... 356/388, 383, 356/386, 387

[56] References Cited

U.S. PATENT DOCUMENTS

| 5,721,433 | 2/1998 | Kosaka | 356/335 |
| 5,739,525 | 4/1998 | Greve | 356/237.1 |

*Primary Examiner*—Frank G. Font
*Assistant Examiner*—Reginald A. Ratliff
*Attorney, Agent, or Firm*—Hill & Simpson

[57] ABSTRACT

An optical check for electrical components on an equipping head is provided by moving the suction pipette of the equipping head with the component affixed thereto passed a line sensor that is parallel to the axial direction of the suction pipette. The free end of the suction pipette and the component proceed into the sensor region. The sensor values for the empty suction pipette are compared in an evaluation unit to sensor values of the suction pipette equipped with the component. The presence of the component and/or the height of the component and/or the length of the component are determined by the comparison.

12 Claims, 1 Drawing Sheet

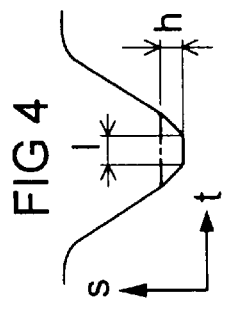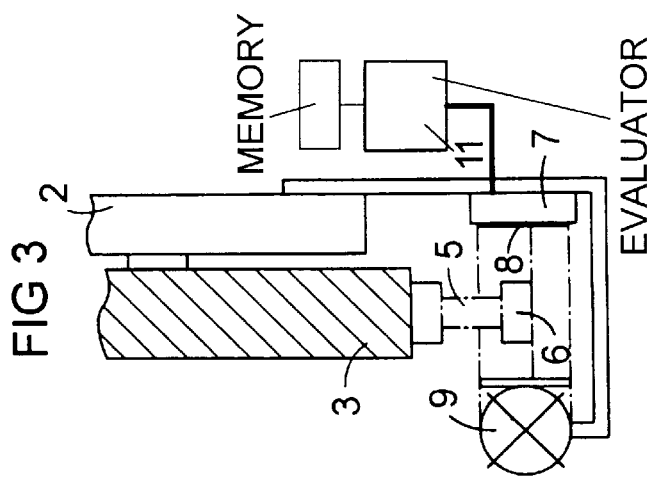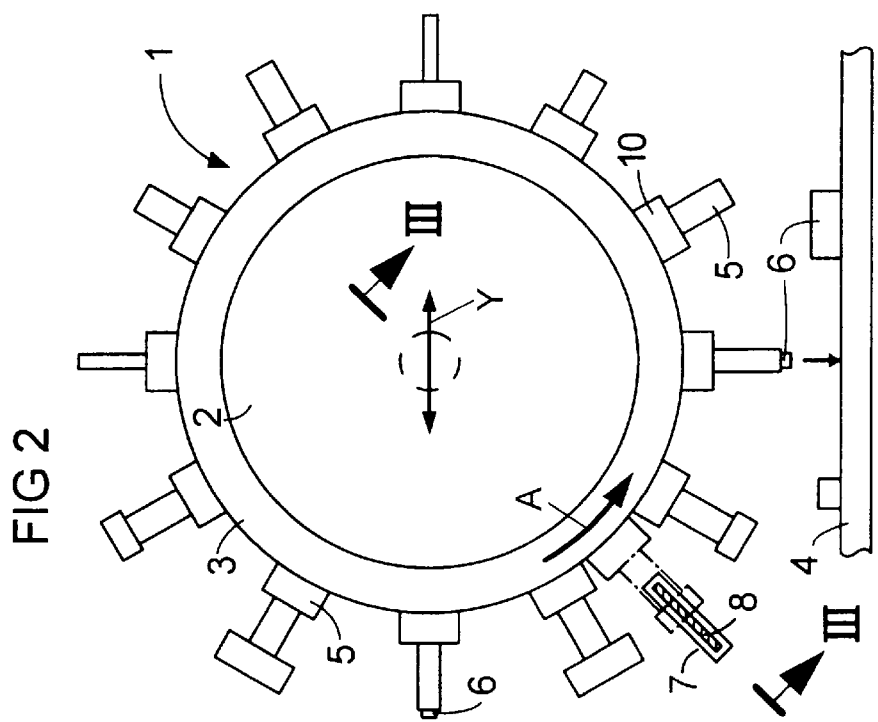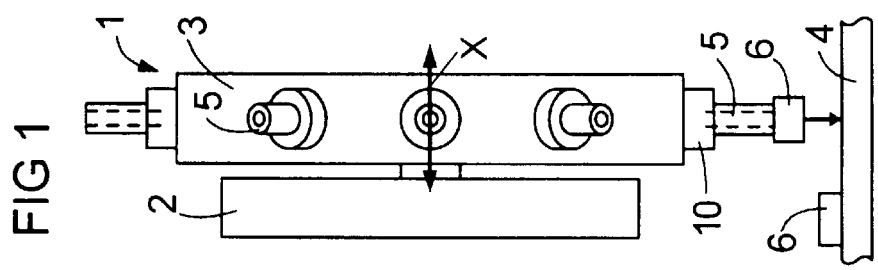

180
METHOD AND APPARATUS FOR OPTICALLY CHECKING AN ELECTRICAL COMPONENT AT AN EQUIPPING HEAD

BACKGROUND OF THE INVENTION

1. Field of the Invention

The present invention is directed to a method and to an apparatus for optically checking an electrical component that is held at a suction pipette of an equipping head of an automatic equipping unit for equipping component carriers.

2. Related Art

Up to now, it was standard to check the presence of a component at a suction pipette with a light barrier, whereby an optical receiver detects an intensity change of the received light pulses as the component passes through the light barrier. The suction pipettes can differ in length and thickness dependent on the type and thickness of the components to be equipped. Especially given the use of small components, it is therefore difficult to find a location for the sensor at which the component is sure to be acquired by the sensor.

SUMMARY OF THE INVENTION

The present invention is based on an object of increasing the recognition certainty and simplifying the evaluation of components held by a suction pipette. This and other objects are achieved by a method for optically checking an electrical component that is held on a suction pipette of an equipping head of an automatic equipping unit for mounting components on a carrier, including the steps of generating a cast shadow of at least part of a component to be sensed on an optical sensor by a light source positioned diametrically opposite the optical sensor, evaluating an output of the optical sensor in an electronic evaluation unit connected to the sensor, moving a free end of the suction pipette with the component held at the free end of the suction pipette into a coverage region of the optical sensor, the optical sensor being a line sensor, aligning an axial direction of the suction pipette at least approximately parallel to a longitudinal direction of the line sensor, bringing the suction pipette into a defined position relative to the optical sensor, determining a length of occlusion of the optical sensor by the suction pipette and the component, storing occlusion values of an empty suction pipette in a storage of the evaluation unit, comparing stored values in the evaluation unit to measured sensor values of a suction pipette including a component, and determining the presence and/or the height of the component from deviations between the stored values and measured values.

The length of the occlusion can be exactly read by employing a line sensor that is oriented in parallel to the axial direction of the suction pipette. A light source is arranged at that side of the suction pipette lying diametrically opposite the sensor, this light source being directed onto the sensor and generating a shadow length thereon that corresponds to the length of the suction pipette with the component. A pipette that has no component held thereon or that is holding a component of a different type than desired generates deviant sensor values that indicate a corresponding error. The following equipping event is suppressed given that the component is lacking or is a wrong component, as a result contact of the pipette and the resulting contamination of the empty pipette tip with solder paste is avoided. Also, incorrect components are sorted out.

Since the empty suction pipette is measured before use without a component after every pipette change, the exact height position of each pipette tip can be stored in the register, so that dimension differences and installation tolerances of the suction pipette can be taken into consideration in the later evaluation. Since the sensor values change corresponding to the length of the occlusion, it is also possible to calculate the height of the component over the pipette tip, which enables conclusions to be made about the type of component being held.

A clear difference between the comparison values of the pipette with or without the component derive in the inventive method. As a result thereof, it is possible to implement the component check in a "flying" fashion in that the pipette with the component is moved past the sensor with relatively high uniform speed, so that the measuring operation requires only a slight time expenditure. It is possible to largely avoid the time loss when a physical measuring instrument is placed into the motion path of the suction pipette.

Advantageous developments of the invention are provided by utilizing an equipping head provided with a holder for mutually different types of suction pipettes, bringing the holder into a position that is constant relative to the sensor, determining the sensor values of different types of empty suction pipettes based upon an extent of occlusion of the sensor, permanently storing the sensor values for the different suction pipette types in a storage, determining a height position of each empty pipette tip based upon an extent of occlusion after each pipette change, storing the determined value in a storage, and comparing the stored values to type specific nominal values in the evaluation unit. An improvement of the invention provides that the height of the component is determined by the deviations of the occluded sensor value caused by a pipette carrying the component compared to the sensor value without the component. A further improvement of the method provides that sensor values for occlusion by individual types of components are stored in the storage, and checking the identity of the component is accomplished by comparison of the measured sensor value to the value for the suction pipette in combination with the characteristic value of the component.

Advantages of the invention are provided when the suction pipette is moved passed the sensor, the transmitted light being oriented transverse to the moving direction of the suction pipette, occlusion values being determined by a plurality of motion phases wherein the suction pipette is moved to occlude the sensor a number of times in close succession, and determining a length of the component extending in a moving direction is determined from a time change of the sensor values relative to the speed of the component moving the passed the sensor. This is further improved by moving the suction pipette at a constant speed passed the sensor so that the length of the component may be determined from the time change of the sensor values.

According to the present invention, the electrical component is fixed to a suction pipette of an equipping head of an automatic equipping unit for equipping component carriers, a shadow is cast at least in part by the component on an optical sensor, the light source for the sensor is arranged at the side of the suction pipette opposite the sensor, and the suction pipette with the component is moved between the light source and the sensor. Preferably, the sensor has a sensor surface which is masked by a straight line narrow slotted mask and the sensor detects sensor values which vary according to the length of occlusion of the sensor.

In one embodiment, the sensor and the light source are mounted to a stator of a turret head of an equipping head and the rotor of the equipping head is driveable in an indexed fashion to carry a plurality of suction pipettes which are circularly distributed on the rotor, the sensor being arranged between two stops of the suction pipettes. It is preferred that the sensor be arranged in the proximity of the placement stop for the equipping head for placing the components on the carrier. The suction pipettes are preferably arranged on the rotor radially projecting therefrom and the line-like sensor surface of the sensor is also oriented radially relative to the rotational axis of the rotor.

According to the foregoing advantages, a control program calls the nominal values allocated to the pipette type that is employed and compares these to the measured values of the respective, empty suction pipette. When these measured values lie outside an allowed tolerance range, it is to be assumed that the measured pipette is a different pipette type or that the pipette was incorrectly mounted. In this case, the pipette is discarded and replaced by another, which enhances the functional dependability of the automatic equipping unit.

Due to the storing of the measured values of the mounted suction pipettes, the height differences of the suction pipettes can be taken into consideration in the evaluation of the later working data.

The invention as described in the foregoing makes it possible to identify various component types according to their height and to discard them in a following work step as warranted.

By moving the sensor at a constant speed and determining the length of time that it takes to change sensor values, the invention makes it possible to also acquire and identify the components according to length in the motion direction.

The optical sensor and the oppositely arranged light source makes it possible to implement the inventive method in a simple way.

The sensor is provided with a linear slotted mask over the sensor surface which can be cost-beneficially manufactured and exactly evaluated. The slotted mask can, for example, be provided in a window width of 0.1 mm, so that even components having a width of 0.3 mm can be measured with adequate precision and dependability.

By mounting the sensor and the light source on the stator of the equipping head and moving the rotor in an indexed fashion, the relative motion between the sensor and the suction pipettes is generated by turning the rotor. As a result thereof, it is possible to implement the corresponding check procedures in time-saving fashion during the transport and equipping of the components. The arrangement of the sensor between two stop stations enables a flying measurement of the component to be made without a change in velocity and without loss of time.

Arranging the sensor adjacent the placement station of the equipping head enables a final check of the components to be made immediately before being placed onto the printed circuit board. Should the component on the pipette be lost from the end of the pipette before installation, dipping the empty pipette into the solder paste is avoided. In such a case, the suction openings of the pipette could otherwise be contaminated up to the point of closure.

The radial orientation of the sensor relative to the rotational axis of the rotor enables positioning of the sensor with only a slight distance between the sensor and the pipette, which enhances the imaging precision.

BRIEF DESCRIPTION OF THE DRAWINGS

The invention is explained in greater detail below on the basis of an exemplary embodiment shown in the drawing.

FIG. 1 is an end view of a multiple equipping head;

FIG. 2 is a side view of the equipping head according to FIG. 1;

FIG. 3 is a partial section through the equipping head along the line III—III in FIG. 2, with an optical sensor;

FIG. 4 is a graph which shows a measured value curve of the sensor according to FIG. 3.

DETAILED DESCRIPTION OF THE DRAWINGS

According to FIGS. 1 and 2, a turret-like equipping head 1 is composed of a stator 2 and of a rotor 3 which is rotatably seated on the stator. The equipping head 1 is movable over a component carrier such as printed circuit board 4 in the coordinate directions indicated by the double arrows X and Y.

The rotor 3 comprises a plurality of suction pipettes 5 projecting radially outward from the rotor 3 that are interchangeably seated in rotational-symmetrically arranged uniform holders 10 of the equipping head 1 and at whose suction ends electrical components 6 are held by low pressure, as is well known. As indicated by the curved arrow A, the components can be successively turned into their placement position over the printed circuit board 4 by an indexed rotation of the rotor 3 corresponding to the pipette division. An optical sensor 7 is arranged in an angular position between two stop stations preceding the placement station, the optical sensor 7 comprising a line-like sensor surface 8 that extends parallel to the axial direction of the suction pipette 5 which the pipette passes in a rotary fashion during turning of the rotor 3. The sensing position of the pipette is indicated by dot-dashed lines.

According to FIG. 3, the sensor 7 and a light source 9 are rigidly connected to the stator 2. The light source 9 is arranged at that side of the suction pipette 5 lying diametrically opposite the sensor surface 8 and is fashioned as a parallel beam light source whose emitted light is directed perpendicular to the rotational plane of the suction pipettes 5. The light source 9 and the sensor 7 are arranged such that the end of the suction pipette and the component 6 adhering thereto project completely into the region of the sensor surface. The sensor surface 8 is occluded by an amount corresponding to the length of the suction pipette 5 plus the height of the component 6.

The sensor surface 8 is provided with a narrow window through which light from the source 9 passes. Since the measured output values of the sensor 7 vary in an analogous way to the occluded length, these measured values can be utilized for the height determination of the component in an electronic evaluation means 11 that is connected to the sensor 7. The evaluation means 11 identifies output levels as corresponding occlusion lengths and compares the occlusion length to known lengths.

FIG. 4 shows a diagram of the sensor values s varying over the time t when the suction pipette 5 that is equipped with a component 6 moves continuously past the sensor 8, whereby the dot-dash section of the curve represents the sensor values 3 of an empty suction pipette 5 without attached component. The curve exhibits a high starting value corresponding to the received light intensity. As soon as the suction pipette 5 with the component 6 begins to occlude the line sensor 7, these values drop until the suction pipette 5 and the component 6 have their full length located in the region of the sensor surface 8. The sensor values in section 1 of the curve remain unmodified in conformity with the length of the component lying in the moving direction and in turn increase as the coverage of the sensor surface 8 subsequently becomes less. A determination of the actual length of the component is made from the length of the constant section 1 of the measured curve. One or several passes may be made past the sensor to obtain the length measurement.

Further, the height difference between the equipped and unequipped suction pipette 5 is determined and, thus, the height of the component 6 is calculated from the height difference h between the dot-dash line and the section 1. This difference is thus used not only for monitoring the presence of the component 6 but also for checking the component type. The evaluation means records known heights and lengths of components in use and may be able to determine a component identify from the height and length values.

Although various minor modifications might be suggested by those skilled in the art, it should be understood that our wish to embody within the scope of the patent warranted hereon all such modifications as reasonably and properly come with the scope of our contribution to the art.

We claim as our invention:

1. A method for optically checking an electrical component that is held on a suction pipette of an automatic equipping unit for equipping component carriers, comprising the method steps of:

casting a shadow of at least a portion of the component on an optical sensor, the cast shadow being a result of occlusion of a light source arranged diametrically opposite the sensor;

evaluating an output of the sensor in an evaluation unit;

moving a free end of the suction pipette with the component held thereon into a coverage region of the optical sensor, the optical sensor being a line sensor;

aligning an axial direction of a suction pipette of at least approximately parallel to a longitudinal direction of the line sensor during sensing;

positioning the suction pipette having a defined position relative to the sensor;

determining a length of occlusion by the suction pipette and the component on the sensor;

storing occlusion values in a storage of the evaluation unit for an empty suction pipette;

comparing stored values for the empty suction pipette to measured sensor values of the suction pipette including the component; and making a determination based upon differences between the stored values and the measured values.

2. A method as claimed in claim 1, wherein said determining step determines presence of the component on the suction pipette.

3. A method as claimed in claim 1, wherein said determining step determines a height of the component on the suction pipette.

4. A method as claimed in claim 1, further comprising:

providing a plurality of mutually different types of suction pipettes on a holder of the equipping head;

positioning the holder at a constant position relative to the sensor;

determining sensor values for the different types of suction pipettes in an empty condition by an extent of occlusion of the sensor;

storing the sensor values of different pipette types in a storage unit as type specific nominal values;

determining a height position of an empty pipette tip based upon occlusion after a pipette change;

storing a value after the pipette change in a storage; and comparing the value after the pipette change to the type specific nominal values.

5. A method as claimed in claim 1, further comprising:

storing characteristic values of occlusion for component types in a storage; and checking an identity of a component by comparison with stored values for a suction pipette and characteristic values for a component to measured sensor values.

6. A method as claimed in claim 1, further comprising:

moving a suction pipette passed the sensor;

orienting transmitted light onto the sensor in a direction transverse to a moving direction of the suction pipette;

performing a plurality of motions of the sensor pipette in close succession to obtain occlusion values; and determining a length of the component on the suction pipette extending in a moving direction by a time change of sensor values relative to a motion path of the component.

7. A method as claimed in claim 6, wherein said suction pipette is moved passed the sensor at a constant speed and said determination of length is obtained by a time change of sensor values.

8. An apparatus for optically checking an electrical component held on a suction pipette of an equipping head of an automatic equipping unit for equipping component carriers, comprising:

an optical sensor positioned to receive a cast shadow of an at least a part of a component to be detected;

a light source arranged at a side of the suction pipette opposite the optical sensor to cast a shadow of said component on said optical sensor, said shadow having a length corresponding to an occlusion of light from said light source by said suction pipette and potentially by said component;

means for moving the suction pipette with the component thereon between the light source and the optical sensor; and an evaluator connected to an output of said optical sensor and operable to compare occlusion lengths of said suction pipette with said component to predetermined occlusion lengths to check for presence of a correct component on said suction pipette.

9. An apparatus for optically checking an electrical component held on a suction pipette of an equipping head of an automatic equipping unit for equipping component carriers, comprising:

an optical sensor positioned to receive a cast shadow of an at least a part of a component to be detected;

a light source arranged at a side of the suction pipette opposite the optical sensor; and means for moving the suction pipette with the component thereon between the light source and the optical sensor;

wherein said optical sensor includes a sensor surface and a straight line narrow slotted mask, said optical sensor outputting sensor values analogous to a length of occlusion of the sensor surface.

10. An apparatus as claimed in claim 8, wherein said optical sensor and said light source are secured to a stator of the equipping head, wherein said equipping head includes a rotor moveable between indexed positions and carrying a plurality of radially arranged suction pipettes; said sensor being arranged between to index stops of the suction pipettes.

11. An apparatus as claimed in claim 10, wherein said sensor is arranged proximate to a placement station of the equipping head for equipping the component of the component carrier.

12. An apparatus as claimed in claim 10, wherein said rotor includes radially projecting suction pipettes and wherein said sensor surface is radially arranges relative to an axis of rotation of the rotor.

* * * * *